United States Patent [19]

Heimerl

[11] Patent Number: 5,455,479
[45] Date of Patent: Oct. 3, 1995

[54] MOUNTING FOR QUARTZ-OSCILLATOR DISCS

[75] Inventor: Dieter Heimerl, Landshut, Germany

[73] Assignee: Schott Glaswerke, Mainz, Germany

[21] Appl. No.: 322,529

[22] Filed: Oct. 17, 1994

[30] Foreign Application Priority Data

Oct. 27, 1993 [DE] Germany ............ 43 36 622.8

[51] Int. Cl.⁶ .................................. H01L 41/08
[52] U.S. Cl. ................................ 310/353
[58] Field of Search ............ 310/348, 351–354

[56] References Cited

U.S. PATENT DOCUMENTS

| | | | |
|---|---|---|---|
| 2,784,326 | 3/1957 | Purdue | 310/353 |
| 2,820,911 | 1/1958 | Klingsporn | 310/353 X |
| 2,831,989 | 4/1958 | Ianouchevsky | 310/353 |
| 2,937,293 | 5/1960 | Awender et al. | 310/353 X |
| 4,357,554 | 11/1982 | Peters | 310/353 X |
| 4,511,820 | 4/1985 | Mackenzie | 310/353 |
| 4,706,350 | 11/1987 | Mooney et al. | 29/25.35 |
| 5,350,963 | 9/1994 | Heimerl et al. | 310/353 |

FOREIGN PATENT DOCUMENTS

| 1810172 | 6/1970 | Germany . |
|---|---|---|
| 443418 | 2/1968 | Switzerland . |

Primary Examiner—Mark O. Budd
Attorney, Agent, or Firm—Michael D. Bednarek; Marks & Murase

[57] ABSTRACT

A mounting (1) for quartz-oscillator discs (2) is described, which mounting exhibits a base plate, two current feed-through pins (4a, b), which are fastened in an insulated manner in the base plate, and a central contact pin (15). Within the base plate (20) there is provided a receiving groove (25) for the quartz-oscillator disc (2), which is fastened to the mounting only at the two fastening points (31 and 32). The receiving sections (7a, 7b) of the lugs (6a, 6b) respectively exhibit a slot (8a, b), which extends far enough downwards that the quartz-oscillator disc no longer touches the lug (6a, 6b) in the lower section of the slot. In addition, the lug can exhibit a recess (40), which forms in the vertical direction an additional spring element.

12 Claims, 3 Drawing Sheets

MOUNTING FOR QUARTZ-OSCILLATOR DISCS

DESCRIPTION

The invention relates to a mounting for quartz-oscillator discs, having a base plate, having two current feedthrough pins, which are fastened in an insulated manner in the base plate and respectively exhibit a lug having a receiving section for holding the marginal region of the quartz-oscillator disc, and having a central contact pin connected in an electrically conductive manner to the base plate, which, on its top side, exhibits a receiving groove in which the rim of the quartz-oscillator disc engages.

The most important characteristic of a filter or oscillator which is realized on the basis of the precise natural frequency of the quartz crystal is the frequency stability. It is herein important that in the assembly, in particular as the protective cap is being welded on, in the event of temperature variation or following aging, the mounting of the quartz-oscillator disc develops no mechanical stresses which might result in undesirable frequency changes. Nor must the mounting place the quartz-oscillator disc under so much strain, under mechanical load, that fracturing results.

Where a quartz-oscillator disc is used as a filter (as in, e.g., U.S. Pat. No. 4,511,820), this must be electrically contacted at three points. The mounting for the quartz-oscillator disc accordingly exhibits three electrical contact pins, the outer contact pins being guided through the base plate of the mounting and either, for the configuration of receiving sections, are squeezed flat or exhibit welded-on spring elements. The central electrical contact pin is connected conductively to the base plate, on the top side of which there is fastened, in a metallically conductive manner, a middle fork in which the quartz-oscillator disc engages with its marginal region.

By means of an electrically conductive adhesive, the quartz-oscillator disc is secured in the middle fork and in the receiving sections of the outer contact pins.

The quartz-oscillator disc bears, apart from against the three electrical contact points where it is secured by means of an adhesive, additionally against further points on the mounting (see, e.g., points 88, 90, 92 and 94 in FIG. 14 of U.S. Pat. No. 4,511,820), so that, should mechanical loads arise, tears and fractures originate from these holding points of the quartz-oscillator disc with the mounting.

A further problem relates to the structural height of the ready-fitted quartz housing. Assuming a given diameter of the quartz-oscillator disc, even though the structural size can be reduced by segmentation of the quartz-oscillator disc and of the correspondingly low locking cap, the quartz-oscillator disc is still unable to be applied directly to the plate bar, for the following reasons. The welded middle fork namely demands a free space between the fork and the surface of the base plate in order to counterbalance tolerance fluctuations relating to the position of the quartz-oscillator disc in the two outer mountings. In the case of welded outer mountings, a certain minimum base height must on the other hand be observed, so that the middle fork also must be fitted on the base plate at a corresponding distance. In the case of integrated middle forks, a minimum bow width is once again necessary in the attachment region of the base plate, so that the receiving region for the quartz-oscillator disc is provided at a predefined distance above the base plate.

In place of a middle fork, according to German Offenlegungsschrift 22 39 685 an elevation is provided in the middle region of the base plate, which elevation juts out over the surface of the base plate. In this elevation there is provided a slot-shaped indentation in the form of a receiving groove, which, in the manufacture of the base plate, can be simultaneously fitted. The indentation is configured in such a width that the edge of the quartz-oscillator disc is able to be inserted and therein takes hold. On the side lying opposite the elevation there is fitted, in the manufacture of the base plate, an indentation, into which the end of the central contact pin juts. In the case of this known mounting also, the structural height is comparable with the kinds of mountings which exhibit a middle fork.

In this known mounting according to German Offenlegungsschrift 22 39 685, a further drawback consists in the fact that the lugs are flatly configured and are angled-off in a V-shape. The openings of the V-shaped part are mutually aligned and the indentations serve for the insertion of the quartz-oscillator disc. The quartz-oscillator disc, the rim of which has to be cut straight, thus bears in the entire region against the receiving sections, so that the quartz-oscillator disc as a whole is strongly clamped and mechanical stresses likewise result in considerable damage to the quartz-oscillator disc.

The object of the invention is therefore a mounting of quartz-oscillator discs in tripolar construction, by which the mechanical shock resistance is improved and the smallest possible structural height is attained.

This object is achieved with a mounting according to Patent Claim 1. Advantageous embodiments are the subject of the subclaims.

The invention is based upon integrated holders, i.e. quartz holders, which are produced from a single part with the current feed-throughs and in which the current feed-through pin is configured at the upper end for the reception of the quartz-oscillator disc. The small structural height attained by this type of current feed-through pin can be fully realized, in a three-pin construction of a quartz-oscillator mounting, where, according to the invention, the receiving groove is configured within the base plate. This enables the quartz-oscillator disc to be fitted low enough for the lower marginal region of the quartz-oscillator disc to vanish in the base plate.

Preferably, the receiving groove is wider than the thickness of the quartz-oscillator disc, thereby enabling the latter to be embedded, for contacting purposes, in an electrically conductive adhesive.

A further reduction in the structural depth can be achieved where the groove is configured as a double groove, the second groove being configured narrower than the first groove and the second groove being made within the first groove in the base plate. The second groove herein serves for the securement of the quartz-oscillator disc and the first groove the reception of the electrically conductive adhesive, the depth of the first groove preferably being matched to the thickness of the applied adhesive such that this does not project relative to the top side of the base plate.

According to one embodiment, the width of the second groove can correspond to the thickness of the quartz-oscillator disc, so that, in the assembly of the quartz-oscillator disc prior to the application of the adhesive, a positional fixing in the lower region of the quartz-oscillator disc is enabled.

The improvement in the mechanical shock resistance of the mounting is achieved by the fact that the quartz-oscillator disc is held, apart from at the previously described fastening point, merely at two further fastening points. Each receiving section of the current feed-through pins is configured such that it acts only at one fastening point upon the quartz-oscillator disc. By a fastening point of this kind is meant a point of contact of quartz-oscillator disc and receiving section, at which the receiving section bears under spring tensioning against the quartz-oscillator disc. In the case of these fastening points, the active force component is directed parallel to the disc face.

It has been shown that mechanical stresses upon the quartz-oscillator disc can best be absorbed, without damage to the quartz-oscillator disc, where the three fastening points are disposed such that they form an approximately equilateral triangle.

Preferably, the quartz-oscillator disc is secured on the mounting, at these three fastening points evenly distributed over the periphery of the quartz-oscillator disc, by means of an electrically conductive adhesive.

According to one particular embodiment, the lugs possess in their receiving section, for the engagement of the marginal region of the quartz-oscillator disc, a respective slot of sufficient length that the lower section of the disc remains free whenever the quartz-oscillator disc is inserted. In this embodiment, the receiving section bears against the peripheral rim of the quartz-oscillator disc only with the upper end region of the slot, so that the quartz-oscillator disc does not touch the lower end of the slot.

The slot width does not have to be equal to the thickness of the quartz-oscillator disc but can also be larger, since the quartz-oscillator disc is secured in the fastening point, by means of the electrically conductive adhesive, against lateral slippage.

In order to reduce production tolerances of the quartz-oscillator disc or any stresses which might possibly arise during temperature variations or as the quartz oscillator is welded, and to increase flexibility in the vertical direction, the two current feed-through pins can be provided with an additional form-out, which extends preferably away from the quartz-oscillator disc. A spring element is thereby formed, which guarantees additional flexibility in the vertical direction of the lug.

The flexibility of the form-out in the vertical direction can be further increased by virtue of the slot extending into the form-out, thereby ensuring that the quartz-oscillator disc, with regard to a 3-point suspension mounting, does not touch the lug at the lower end of the slot. The form-out can be differently configured as a loop or the like, in which case care has to be taken to ensure that the design fulfills not only the flexibility requirement, but also the need for necessary stiffness. If the flexibility were too great, the quartz-oscillator disc, in the event of vibrations, could be far enough deflected that it hits against the outer wall. The format must also be shaped such that the cap over the quartz oscillator, which cap, once the quartz oscillator is fitted, is necessary to form a hermetic seal, does not come into contact with the said quartz oscillator.

Illustrative embodiments of the invention are explained in greater detail below with reference to the drawings, in which.

Figure 1:
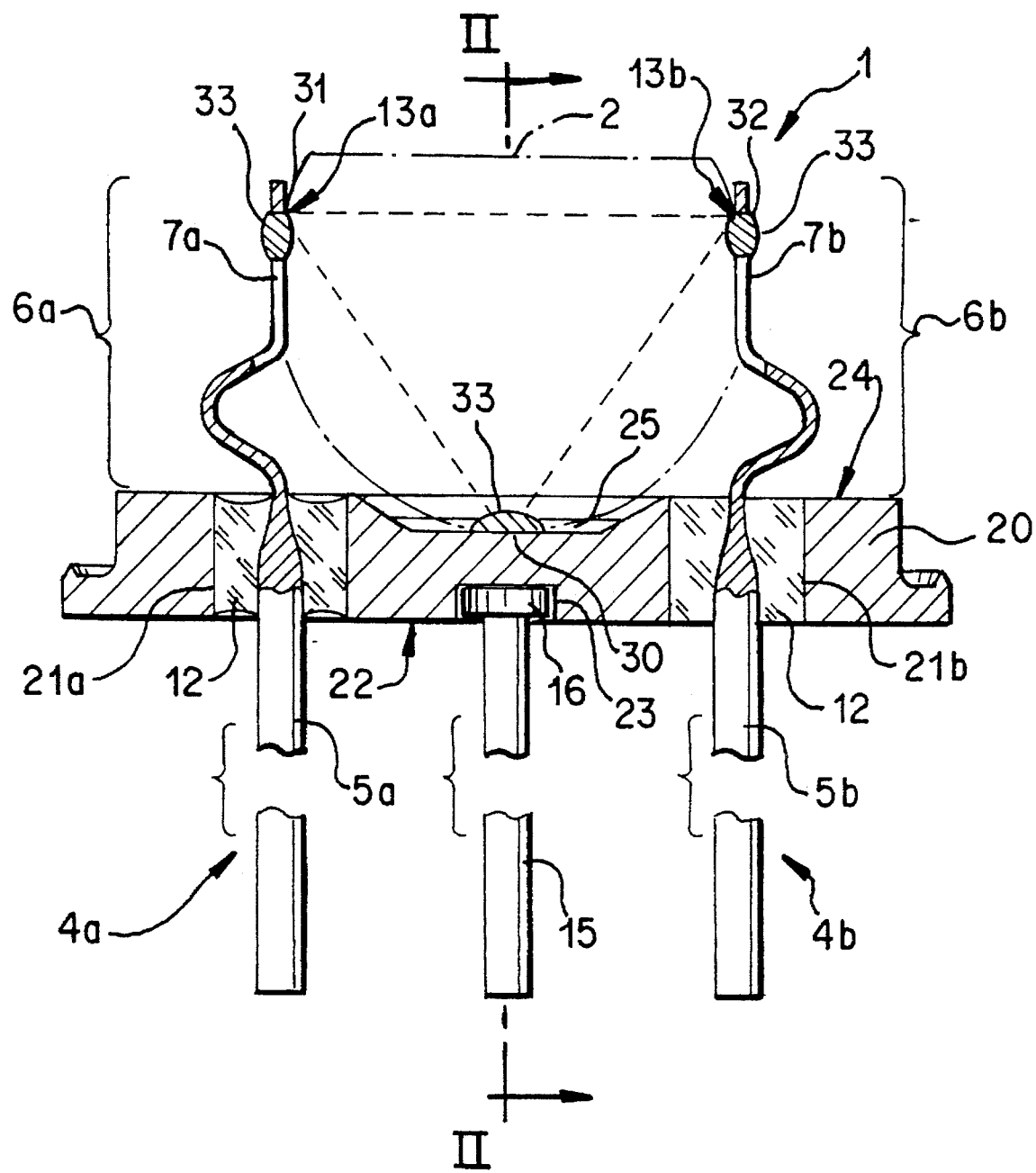
FIG. 1 shows a frontal view of a quartz-oscillator mounting, the base plate being represented in section.

In FIG. 1, a mounting 1 in tripolar construction is represented. Two current feed-through pins 4a, 4b are fastened in bores 21a, 21b of a base plate 20 by means of a sealing material 12. The pin sections 5a, 5b extend into the sealing material 12 and then merge into the lugs 6a, 6b. The lugs 6a, 6b respectively possess a slot 8a, 8b (see FIG. 2) in the respective receiving section 7a, 7b, in which receiving sections the respective marginal region of the quartz-oscillator disc 2 engages, bearing only against the upper section 13a, 13b of the slot 8a, 8b, where a fastening point 31, 32 is thus respectively formed. At these fastening points 31, 32, the quartz-oscillator disc is secured by means of an electrically conductive adhesive 33.

On the bottom side 22 of the base plate 20, which can consist of Kovar (registered trademark) or steel, the central contact pin 15 is inserted by its nail head 16 flush in a recess 23. The contact pin 15 can, for example, be soldered in or welded in. On that side of the base plate 20 lying opposite the central contact pin 15, a groove 25 is made, in which the lower marginal region of the quartz-oscillator disc 2 engages. The length of the groove 25 is greater than that marginal region of the quartz-oscillator disc 2 which intrudes into the base plate 20, so that the latter is not bearing with its peripheral face against the base plate 20. For the configuration of a lower fastening point 30, the quartz-oscillator plate 2 is embedded into the electrically conductive adhesive 33. As can be inferred from FIG. 1, the three fastening points 30, 31 and 32 form approximately a unilateral triangle.

Figure 2:
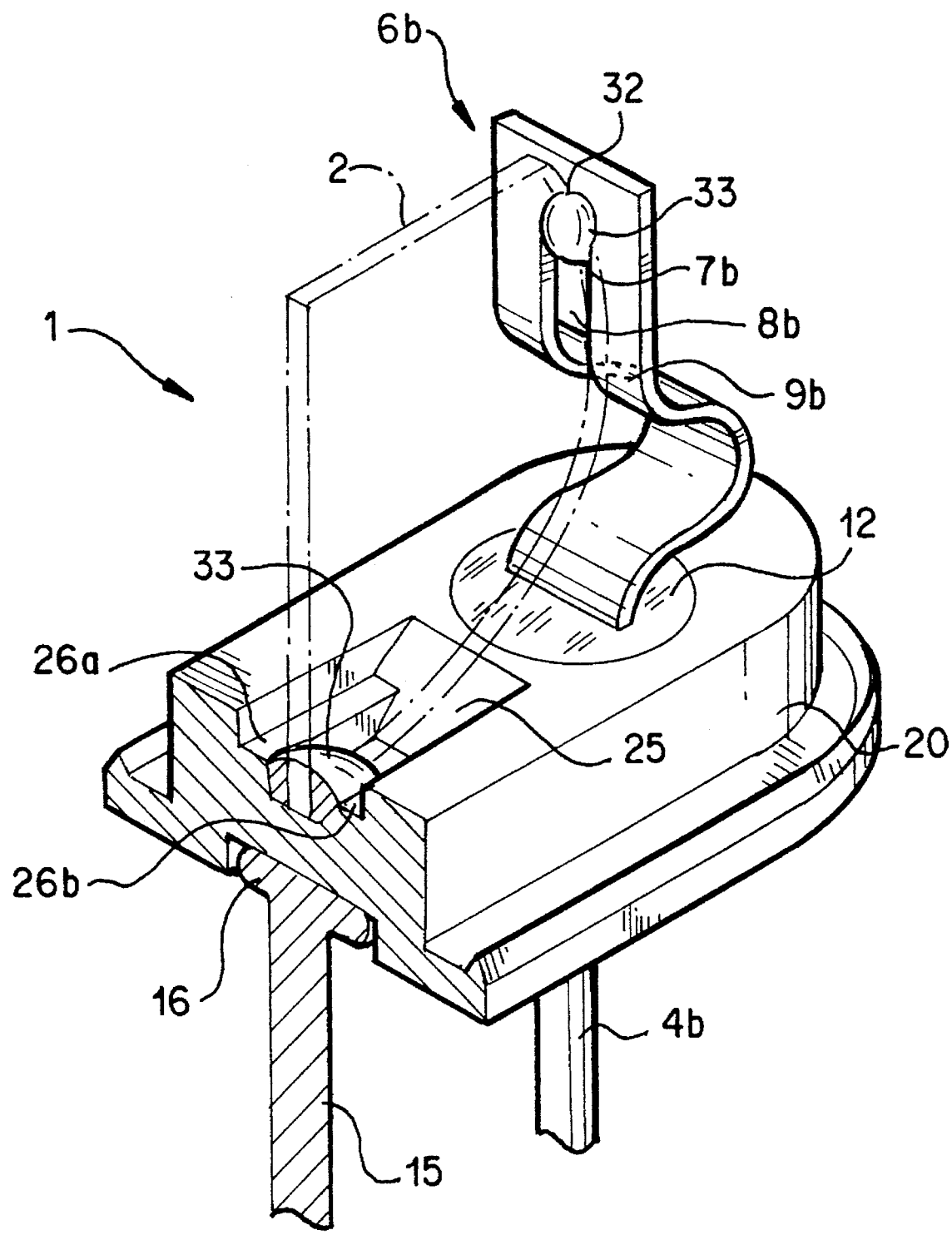
FIG. 2 shows the mounting shown in FIG. 1, in section along the line II—II, in perspective representation.

In FIG. 2, a section along the line II—II of the mounting 1 shown in FIG. 1 can be seen in perspective representation. The slot 8b extends far enough in the direction of the base plate 20 that the lower section 9b of the slot 8b remains free and does not bear against the peripheral rim of the quartz-oscillator disc 2. The effect of this is that the lug 6b bears only in the fastening point 32 against the quartz-oscillator disc 2.

In the representation shown in FIG. 2, the groove 25 is configured as a double groove 26a, 26b. The first groove 26a is constructed significantly wider than the second groove 26b, which serves for the reception and securement of the marginal region of the quartz-oscillator plate 2. The second groove 26b can exhibit the same width as the thickness of the quartz-oscillator disc 2. In the representation here shown, the width of the second groove 26b is somewhat greater, however, than the thickness of the quartz-oscillator disc 2, so that, in this region also, the quartz-oscillator disc is embedded in the adhesive 33. The depth of the first groove 26a is preferably chosen such that the adhesive 33 does not project relative to the top side 24 of the base plate 20.

Figure 3:
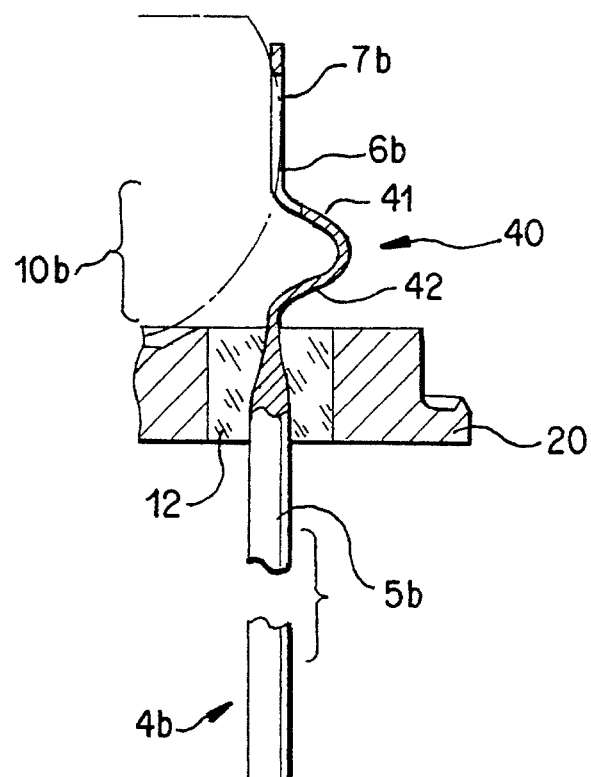
FIG. 3 shows an embodiment of a current feed-through pin in side view.

In FIG. 3, a further embodiment of a current feed-through pin 4b is represented. Above the base plate 20, the pin section 5b merges initially into a form-out 40, to which the lug 6b is adjoined. The form-out 40, like the receiving section 7b, can be squeezed flat and can thus be a component part of the lug 6b. The form-out 40 is formed by a loop and thus constitutes a spring element, which guarantees additional flexibility in the vertical direction of the lug 6b. The length and the radii of the sections 41, 42 of the spring element are matched, in design, to the flexibility requirements.

Figure 4:
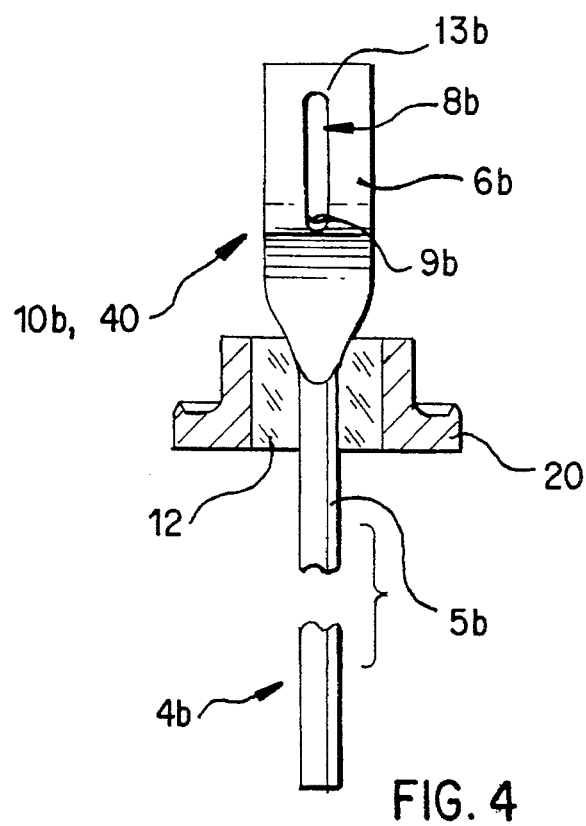
FIG. 4 shows the current feed-through pin shown in FIG. 3, in a further side view.

In FIG. 4 there can be seen a side view of the embodiment of the current feed-through pin 4b shown in FIG. 3. The slot 8b extends with its lower section 9b into the region of the form-out 40.

Reference symbol list:
1 quartz-oscillator mounting
2 quartz-oscillator disc
4a, b current feed-through pin
5a, b pin section
6a, b lug
7a, b receiving section
8a, b slot
9a, b lower section of the slot
10a, b lower section of the lug
12 sealing material
13a, b upper section of the slot
15 central contact pin
16 nail head
20 base plate
21a, b bore
22 bottom side
23 recess
24 top side
25 groove
26a, b double groove
30 fastening point
31 fastening point
32 fastening point
33 adhesive
40 form-out
41 straight section
42 straight section
43 curved section

I claim:

1. A mounting apparatus for quartz-oscillator discs, comprising:

a base plate;

two current feed-through pins fastened in an insulated manner in the base plate, each feed-through pin including a lug (6a, 6b) having a receiving section (7a, 7b) for holding a marginal region of a quartz-oscillator disc; and a central contact pin connected in an electrically conductive manner to the base plate, the central contact pin including, on its top side, a receiving groove in which a rim of the quartz-oscillator disc engages, the receiving groove (25) being configured within the base plate (20), and each receiving section (7a, b) being configured such that it acts only at one fastening point (31, 32) upon the quartz-oscillator disc (2).

2. The mounting apparatus according to claim 1, wherein the fastening points (31, 32) of said receiving sections are disposed such that they form with a fastening point (30) located in the receiving groove (25) an approximately equilateral triangle.

3. The mounting apparatus according to claim 2, wherein the quartz-oscillator disc (2) is secured at the three fastening points (30-32) by means of an electrically conductive adhesive (33).

4. The mounting apparatus according to claim 1 wherein the lugs (6a, 6b) exhibit in their receiving sections (7a, b), for the engagement of the marginal region of the quartz-oscillator disc (2), a respective slot (8a, b) of sufficient length that the lower section (9a, b) of the slot (8a, b) remains free whenever the quartz-oscillator disc (2) is inserted.

5. The mounting apparatus according to claim 1 wherein the receiving groove (25) is wider than the thickness of the quartz-oscillator disc (2), and the quartz-oscillator disc (2) is embedded in the receiving groove (25) in an electrically conductive adhesive (33).

6. The mounting apparatus according to claim 1, wherein the receiving groove (25) is configured as a double groove (26a, b) having first and second grooves, the second groove (26b) being configured narrower than the first groove (26) and located within the first groove (26a).

7. The mounting apparatus according to claim 6, wherein a width of the second groove (26b) corresponds to a thickness of the quartz-oscillator disc (2).

8. The mounting apparatus according to claim 6, wherein the quartz oscillator disc (2) is embedded in the receiving groove (25) in an electrically conductive adhesive (33), and a depth of the first groove (26a) is matched to the thickness of the adhesive (33) such that the adhesive does not project above a top side (24) of the base plate (20).

9. The mounting apparatus according to claim 1, wherein the quartz-oscillator disc (2) is secured at a respective upper slot section (13a, b) to the lugs (6a, b) by means of an adhesive (33).

10. The mounting apparatus according to claim 1, wherein the lugs (6a, b) exhibit in a lower section (10a, b) of each lug a form-out (40).

11. The mounting apparatus according to claim 10, wherein the form-out (40) extends away from the quartz-oscillator disc (2).

12. The mounting apparatus according to claim 10, wherein a slot (8a, b) is defined in each lug and extends into the form-out (40).

* * * * *